United States Patent
Toyama et al.

(10) Patent No.: US 12,374,653 B2
(45) Date of Patent: Jul. 29, 2025

(54) MANUFACTURING METHOD OF SEMICONDUCTOR DEVICE AND WIRE BONDING APPARATUS

(71) Applicant: SHINKAWA LTD., Tokyo (JP)

(72) Inventors: Toshihiko Toyama, Tokyo (JP); Shinsuke Tei, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 610 days.

(21) Appl. No.: 17/769,760

(22) PCT Filed: Jun. 7, 2021

(86) PCT No.: PCT/JP2021/021614
§ 371 (c)(1),
(2) Date: Apr. 18, 2022

(87) PCT Pub. No.: WO2022/259329
PCT Pub. Date: Dec. 15, 2022

(65) Prior Publication Data
US 2023/0282613 A1    Sep. 7, 2023

(51) Int. Cl.
*H01L 23/00* (2006.01)
*B23K 20/00* (2006.01)
(Continued)

(52) U.S. Cl.
CPC ............ *H01L 24/85* (2013.01); *B23K 20/005* (2013.01); *B23K 20/10* (2013.01); *B23K 28/02* (2013.01);
(Continued)

(58) Field of Classification Search
CPC ......... H01L 24/85; H01L 24/45; H01L 24/78; B23K 20/005; B23K 20/10
See application file for complete search history.

(56) References Cited

U.S. PATENT DOCUMENTS 5,967,401 A * 10/1999 Nishiura ............. B23K 20/007
   228/180.5
5,989,995 A * 11/1999 Nishiura ................. H01L 24/48
   228/180.5

(Continued)

FOREIGN PATENT DOCUMENTS

JP    2001274186    10/2001
JP    2007220699    8/2007
(Continued)

OTHER PUBLICATIONS

"International Search Report (Form PCT/ISA/210) of PCT/JP2021/021614," mailed on Aug. 24, 2021, pp. 1-3.
(Continued)

*Primary Examiner* — Nathan W Ha
(74) *Attorney, Agent, or Firm* — JCIPRNET

(57) ABSTRACT

A manufacturing method of a semiconductor device includes: a first step of, after joining a wire to an electrode using a capillary, forming a wire part by moving the capillary to a third target point while feeding out the wire; a second step of forming a bent part by moving the capillary to a fourth target point while feeding out the wire; a third step of processing the bent part into a planned cut part by repeating lowering and raising of the capillary for multiple times; and a fourth step of cutting the wire at the planned cut part by raising the capillary with a wire clamper closed to form a pin wire.

8 Claims, 11 Drawing Sheets

(51) Int. Cl.
*B23K 20/10* (2006.01)
*B23K 28/02* (2014.01)
*H01L 25/065* (2023.01)
*B23K 101/40* (2006.01)

(52) U.S. Cl.
CPC .............. *H01L 24/45* (2013.01); *H01L 24/78* (2013.01); *H01L 25/0657* (2013.01); *B23K 2101/40* (2018.08); *H01L 2224/45005* (2013.01); *H01L 2224/78301* (2013.01); *H01L 2224/78621* (2013.01); *H01L 2224/85205* (2013.01); *H01L 2225/06503* (2013.01); *H01L 2924/40* (2013.01)

(56) References Cited

U.S. PATENT DOCUMENTS

| | | | | |
|---|---|---|---|---|
| 6,112,974 | A * | 9/2000 | Nishiura | B23K 20/005 219/56.22 |
| 6,176,416 | B1 * | 1/2001 | Tsai | H01L 24/49 228/110.1 |
| 8,191,759 | B2 * | 6/2012 | Tei | H01L 24/85 228/180.5 |
| 8,404,520 | B1 * | 3/2013 | Chau | H01L 23/3128 257/E23.024 |
| 8,496,158 | B2 * | 7/2013 | Zong | B23K 20/007 228/103 |
| 9,793,236 | B2 * | 10/2017 | Sekine | B23K 20/005 |
| 11,450,640 | B2 * | 9/2022 | Tei | H01L 24/742 |
| 11,646,291 | B2 * | 5/2023 | Eacock | H01L 24/78 700/108 |
| 12,087,725 | B2 * | 9/2024 | Toyama | H01L 24/78 |
| 2001/0023534 | A1 * | 9/2001 | Tamai | H01L 24/85 29/843 |
| 2002/0023942 | A1 * | 2/2002 | Terakado | B23K 20/005 228/180.5 |
| 2002/0109237 | A1 * | 8/2002 | Oka | H01L 24/86 257/777 |
| 2005/0173791 | A1 * | 8/2005 | Hsu | H01L 24/85 257/E23.033 |
| 2006/0175383 | A1 * | 8/2006 | Mii | B23K 20/007 228/180.5 |
| 2007/0187467 | A1 | 8/2007 | Toyama et al. | |
| 2010/0065963 | A1 * | 3/2010 | Eldridge | H01L 24/85 257/734 |
| 2011/0180590 | A1 * | 7/2011 | Akiyama | H01L 24/85 228/103 |
| 2011/0278349 | A1 | 11/2011 | Tei et al. | |
| 2014/0138426 | A1 * | 5/2014 | Hagiwara | H01L 24/85 228/160 |
| 2014/0370663 | A1 * | 12/2014 | Bayerer | H01L 24/85 438/612 |
| 2015/0017765 | A1 * | 1/2015 | Co | B23K 20/007 438/126 |
| 2015/0129647 | A1 | 5/2015 | Haba et al. | |
| 2016/0225739 | A1 | 8/2016 | Haba et al. | |
| 2016/0358880 | A1 * | 12/2016 | Sekine | H01L 24/85 |
| 2016/0365330 | A1 * | 12/2016 | Hagiwara | H01L 24/85 |
| 2019/0096847 | A1 * | 3/2019 | Fukamachi | H01L 23/4951 |
| 2020/0286855 | A1 * | 9/2020 | Goh | H01L 24/05 |
| 2024/0203933 | A1 * | 6/2024 | Miura | B23K 20/10 |

FOREIGN PATENT DOCUMENTS

| | | |
|---|---|---|
| JP | 2010161176 | 7/2010 |
| JP | 2016537812 | 12/2016 |

OTHER PUBLICATIONS

"Office Action of Taiwan Counterpart Application", issued on Nov. 11, 2021, with partial English translation thereof, p. 1-p. 6.

* cited by examiner

MANUFACTURING METHOD OF SEMICONDUCTOR DEVICE AND WIRE BONDING APPARATUS

CROSS-REFERENCE TO RELATED APPLICATION

This application is a 371 application of the International PCT application serial no. PCT/JP2021/021614, filed on Jun. 7, 2021. The entirety of the above-mentioned patent application is hereby incorporated by reference herein and made a part of this specification.

TECHNICAL FIELD

The present invention relates to a manufacturing method of a semiconductor device and a wire bonding apparatus.

RELATED ART

When manufacturing a semiconductor device, for example, semiconductor components may be connected up and down by bonding. For such a connection, a wire extending in a rising direction from the surface of the electrode is formed with respect to the surface of the electrode of the semiconductor component. Such wires are referred to as pin wires. The pin wire can be formed, for example, by the method described in Patent Literature 1. In the method described in Patent Literature 1, first, a wire is joined to the surface of the electrode by using a capillary. Next, by moving the capillary, a scratch is formed on the wire with the inner edge part of the capillary. Next, the part from the joint part of the wire to the scratch is made to stand upright from the surface of the electrode. Next, the capillary is lowered. By lowering the capillary, the wire is bent at the scratched part. After that, the capillary is raised with the wire clamper closed. As a result, the wire is cut at the scratched part. By the above steps, a pin wire rising from the surface of the electrode is formed.

CITATION LIST

Patent Literature

[Patent Literature 1] Japanese Patent Lain-Open No. 2007-220699

SUMMARY

Technical Problem

The above-mentioned pin wire is required to have a longer length (pin wire height) from the surface of the electrode to the tip of the pin wire. When forming a high pin wire by using the method described in Patent Literature 1, it is necessary to lengthen the wire part from the joint part to the scratched part. However, in the method described in Patent Literature 1, when the wire is bent at the scratched part, the capillary is lowered with the wire part upright from the surface of the electrode. As a result, a large force acts in the axial direction of the wire part with the lowering of the capillary. Therefore, if the wire part is lengthened, problems such as buckling of the wire part are likely to occur due to the force acting in the axial direction. In this case, the wire part has a part that is easier to be cut than the scratched part. As a result, it becomes difficult to reliably cut the wire at the scratched part. Therefore, it is difficult to form a pin wire having a desired height by the method described in Patent Literature 1.

The present invention describes a manufacturing method of a semiconductor device and a wire bonding apparatus capable of easily forming a pin wire having a desired height.

Solution to Problem

A manufacturing method of a semiconductor device according to an embodiment of the present invention includes: a first step of, after joining a wire to an electrode using a capillary, pulling out the wire to a predetermined length by moving the capillary to a first position while feeding out the wire, wherein the first position is a position above a joint part of the wire and is a position deviated from a normal line of a surface of the electrode that passes through the joint part; a second step of, after moving the capillary to the first position, forming a bent part on the wire by moving the capillary to a second position while feeding out the wire, wherein the second position is a position above the first position and is a position deviated to the joint part side with respect to the first position when viewed from a normal direction in which the normal line extends; a third step of, after forming the bent part, processing the bent part into a planned cut part by repeating lowering and raising of the capillary along the normal direction for multiple times; and a fourth step of, after repeating the lowering and raising of the capillary for the multiple times, cutting the wire at the planned cut part by raising the capillary with a wire clamper closed to form a pin wire.

According to the above manufacturing method, the wire can be reliably cut at the planned cut part. Therefore, the pin wire having a desired height can be easily formed.

When the capillary is moved to the second position, the bent part may be located at a position deviated from the normal line that passes through the joint part. In this case, it is possible to more reliably suppress a situation in which a problem such as buckling occurs in the planned pin wire forming part. As a result, the wire can be more reliably cut at the planned cut part.

When viewed from the normal direction, a movement distance of the capillary from the first position to the second position may be longer than a radius of a tip surface of the capillary. In this case, the wire can be more reliably cut at the planned cut part.

When viewed from the normal direction, a movement distance of the capillary from the first position to the second position may be equal to a movement distance of the capillary from the joint part to the first position. In this case, the wire can be even more reliably cut at the planned cut part.

When the capillary is moved to the second position, a tip surface of the capillary may be located directly above the joint part. In this case, a pin wire in an upright state from the surface of the electrode can be easily obtained.

Multiple semiconductor chips may be stacked in a stepped manner on a board so that a main surface of each of the semiconductor chips is exposed as an exposed surface. The electrode may be provided on the exposed surface of each of the semiconductor chips. The pin wire may be formed for each of the semiconductor chips by performing a series of steps from the first step to the fourth step for each of the semiconductor chips. The series of steps from the first step to the fourth step may be performed in the order of the semiconductor chip on an upper level to the semiconductor chip on a lower level, or from the semiconductor chip on a lower level to the semiconductor chip on an upper level. In this case, the pin wire can be easily formed for each of the semiconductor chips even in a situation where it is difficult to cut the wire by the pressing operation.

A wire bonding apparatus according to another embodiment of the present invention includes: a bonding unit that includes a capillary configured to be movable relative to an electrode; and a control unit that controls an operation of the bonding unit. The control unit provides the bonding unit with: a first control signal of, after joining a wire to the electrode using the capillary, pulling out the wire to a predetermined length by moving the capillary to a first position while feeding out the wire, wherein the first position is a position above a joint part of the wire and is a position deviated from a normal line of a surface of the electrode that passes through the joint part; a second control signal of, after moving the capillary to the first position, forming a bent part on the wire by moving the capillary to a second position while feeding out the wire, wherein the second position is a position above the first position and is a position deviated to the joint part side with respect to the first position when viewed from a normal direction in which the normal line extends; a third control signal of, after forming the bent part, processing the bent part into a planned cut part by repeating lowering and raising of the capillary along the normal direction for multiple times; and a fourth control signal of, after repeating the lowering and raising of the capillary for the multiple times, cutting the wire at the planned cut part by raising the capillary with a wire clamper closed to form a pin wire.

According to the above wire bonding apparatus, the wire can be reliably cut at the planned cut part. Therefore, the pin wire having a desired height can be easily formed.

Effects of Invention

According to the present invention, the manufacturing method of the semiconductor device and the wire bonding apparatus capable of easily forming a pin wire having a desired height are provided.

DESCRIPTION OF THE EMBODIMENTS

Figure 1:
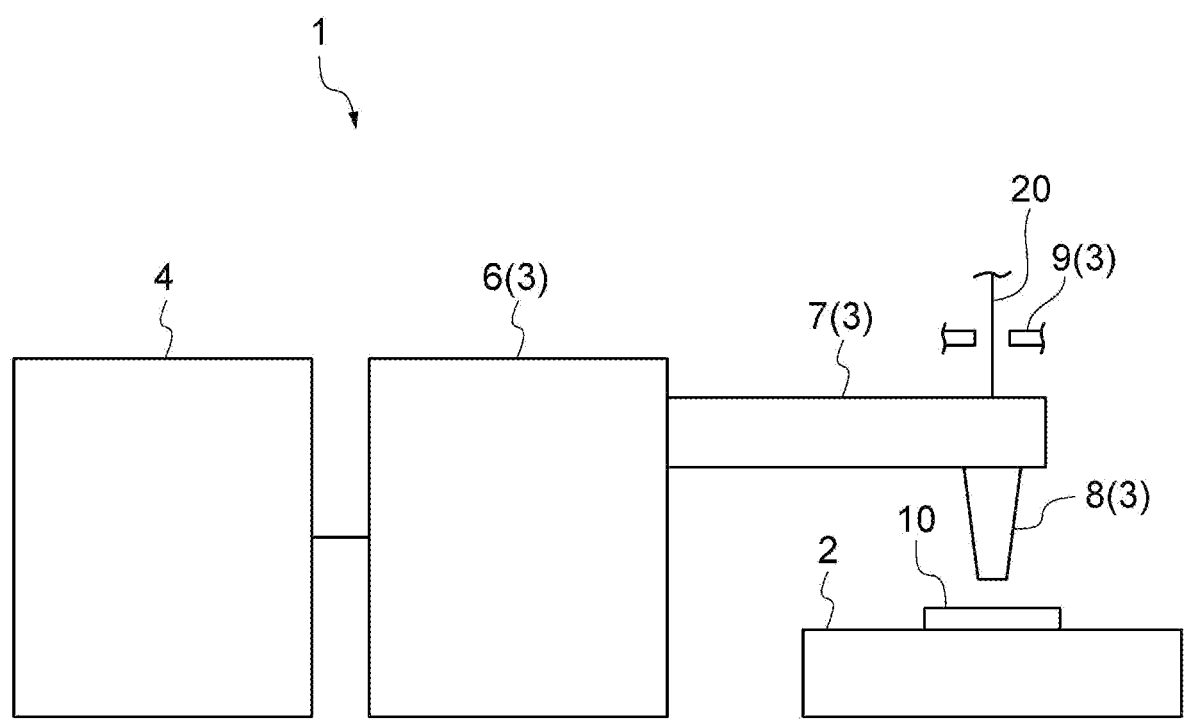
FIG. 1 is a diagram showing a configuration of the wire bonding apparatus of the present invention.

Hereinafter, embodiments of the present invention will be described in detail with reference to the accompanying drawings. In the description of the drawings, the same elements are designated by the same reference numerals, and repeated description will be omitted as appropriate.

[Wire Bonding Apparatus]

In the wire bonding apparatus 1 shown in FIG. 1, for example, a wire 20 is bonded to an electrode provided in a semiconductor device 10. Next, the wire bonding apparatus 1 cuts the wire 20 to a predetermined length. As a result, a pin wire 21 (see FIG. 3) extending in a rising direction from the surface of the electrode is formed. The wire bonding apparatus 1 includes, for example, a transfer unit 2, a bonding unit 3, and a control unit 4.

The transfer unit 2 transfers the semiconductor device 10 which is a component to be processed to a bonding area. The bonding unit 3 includes, for example, a moving mechanism 6, a bonding tool 7, a capillary 8, and a wire clamper 9. The moving mechanism 6 moves the capillary 8 relative to the semiconductor device 10. The capillary 8 for feeding out the wire 20 is detachably provided at the tip of the bonding tool 7. The capillary 8 has a sharp cylindrical shape. The wire 20 is inserted inside the capillary 8. The capillary 8 provides heat, ultrasonic waves or pressure to the wire 20.

The wire clamper 9 is arranged above the capillary 8. The wire clamper 9 is able to grip the wire 20. When the wire clamper 9 is open, the wire 20 is not gripped by the wire clamper 9. When the wire clamper 9 is open, the wire 20 is allowed to be fed out from the capillary 8. When the wire clamper 9 is closed, the wire 20 is gripped by the wire clamper 9. When the wire clamper 9 is closed, the feeding of the wire 20 from the capillary 8 is stopped. The wire 20 is a metal wire having a small diameter. For example, the wire 20 is made of gold (Au), silver (Ag), aluminum (Al), copper (Cu), or an alloy thereof. The diameter of the wire 20 is, for example, 20 μm (micrometer).

The control unit 4 controls the overall operation of the wire bonding apparatus 1 including the operation of the bonding unit 3. The control unit 4 provides some control signals to the bonding unit 3. For example, the control signals include a signal for controlling the position of the capillary 8 with respect to the semiconductor device 10, a signal for starting and stopping the supply of heat, ultrasonic waves or pressure, and a signal for allowing and stopping the feeding of the wire 20 from the capillary 8. The operation by the specific control of the control unit 4 will be described later.

[Semiconductor Device]

Figure 2:
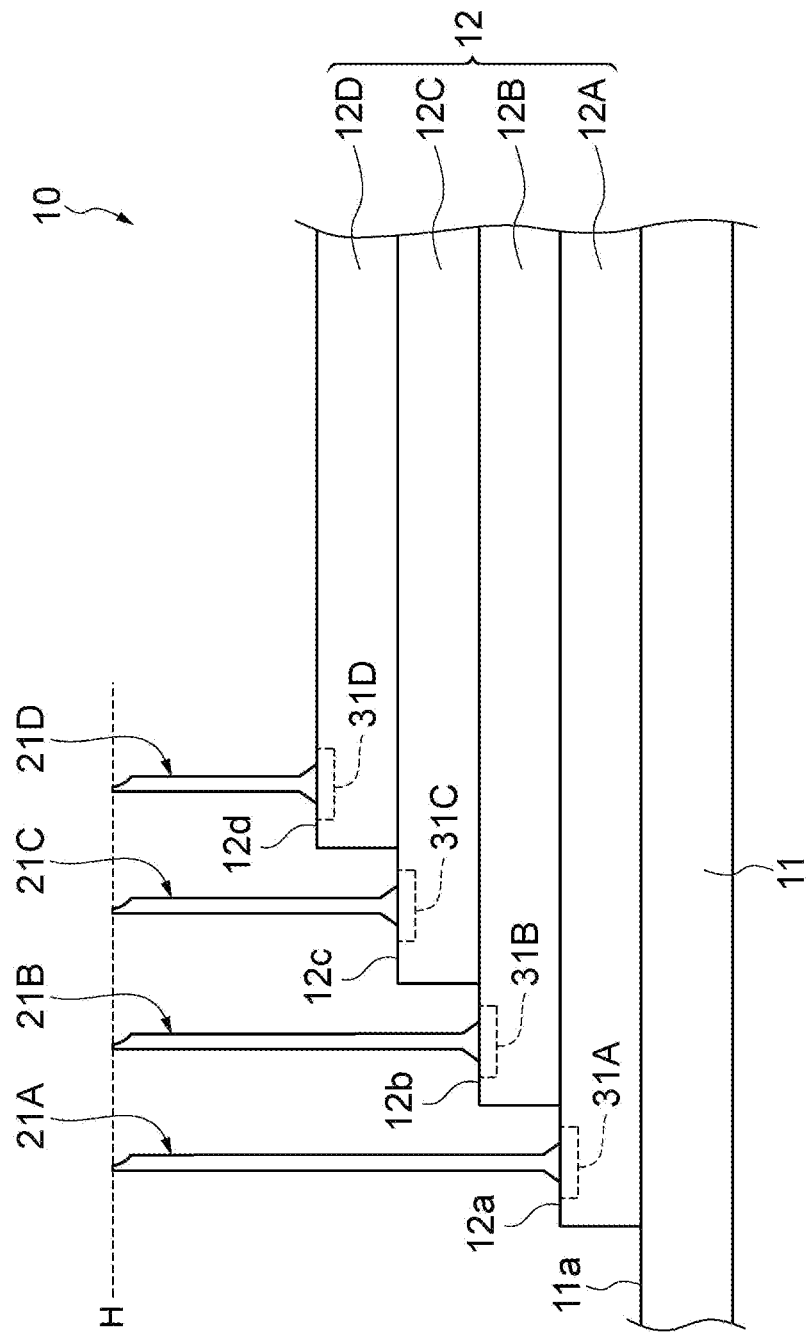
FIG. 2 is a diagram showing a configuration of a semiconductor device manufactured by using the wire bonding apparatus shown in FIG. 1.

The semiconductor device 10 shown in FIG. 2 includes, for example, a circuit board 11, a semiconductor component 12 having multiple semiconductor chips 12A, 12B, 12C, and 12D, and multiple pin wires 21A, 21B, 21C, and 21D. The semiconductor component 12 is fixed to, for example, a main surface 11a of the circuit board 11 by a die bond or the like. The semiconductor component 12 has, for example, a configuration in which the semiconductor chips 12A, 12B, 12C, and 12D are stacked in multiple levels. As an example, the semiconductor component 12 is a multi-level chip memory device.

The semiconductor chips 12A, 12B, 12C, and 12D are stacked to be deviated in a stepped manner. The semiconductor chip 12A is arranged on the main surface 11a of the circuit board 11. The semiconductor chip 12B is arranged on the main surface of the semiconductor chip 12A. The semiconductor chip 12B is deviated from the semiconductor chip 12A along one direction along the main surface 11a of the circuit board 11. The semiconductor chip 12C is arranged on the main surface of the semiconductor chip 12B. The semiconductor chip 12C is deviated from the semiconductor chip 12B along the one direction. The semiconductor chip 12D is arranged on the main surface of the semiconductor chip 12C. The semiconductor chip 12D is deviated from the semiconductor chip 12C along the one direction.

A part of the main surface of the semiconductor chip 12A exposed from the semiconductor chip 12B is an exposed surface 12a exposed from the semiconductor chip 12B. A part of the main surface of the semiconductor chip 12B exposed from the semiconductor chip 12C is an exposed surface 12b exposed from the semiconductor chip 12C. A part of the main surface of the semiconductor chip 12C exposed from the semiconductor chip 12D is an exposed surface 12c exposed from the semiconductor chip 12D. The main surface of the semiconductor chip 12D is an exposed surface 12d exposed on the outer surface of the semiconductor component 12. Electrodes 31A, 31B, 31C, and 31D are provided on the exposed surfaces 12a, 12b, 12c, and 12d, respectively. The surface of the electrode 31A forms the exposed surface 12a. The surface of the electrode 31B forms the exposed surface 12b. The surface of the electrode 31C forms the exposed surface 12c. The surface of the electrode 31D forms the exposed surface 12d.

The pin wires 21A, 21B, 21C, and 21D are provided on the electrodes 31A, 31B, 31C, and 31D, respectively. The pin wires 21A, 21B, 21C, and 21D are parts of the wire 20 cut to a predetermined length. The pin wire 21A is joined to the surface of the electrode 31A. The pin wire 21A extends in a direction rising from the surface of the electrode 31A. The pin wire 21B is joined to the surface of the electrode 31B. The pin wire 21B extends in a direction rising from the surface of the electrode 31B. The pin wire 21C is joined to the surface of the electrode 31C. The pin wire 21C extends in a direction rising from the surface of the electrode 31C. The pin wire 21D is joined to the surface of the electrode 31D. The pin wire 21D extends in a direction rising from the surface of the electrode 31D.

The upper ends of the pin wires 21A, 21B, 21C, and 21D are aligned so as to be located at the same height H with respect to the main surface 11a of the circuit board 11. The lengths of the pin wires 21A, 21B, 21C, and 21D are different from one another. The length of the pin wire 21A provided on the semiconductor chip 12A on the lowermost level is the longest. The length of the pin wire 21B provided on the semiconductor chip 12B on the next level is shorter than the length of the pin wire 21A. The length of the pin wire 21C provided on the semiconductor chip 12C on the next level is shorter than the length of the pin wire 21B. The length of the pin wire 21D provided on the semiconductor chip 12D on the uppermost level is the shortest. The upper ends of the pin wires 21A, 21B, 21C, and 21D are connected to electrodes of another semiconductor component (not shown) provided on the semiconductor component 12. In this way, the semiconductor component 12 and the another semiconductor component are electrically connected to each other via the pin wires 21A, 21B, 21C, and 21D.

Hereinafter, when it is not necessary to separately describe the pin wires 21A, 21B, 21C, and 21D, they are collectively referred to as the "pin wire 21." When it is not necessary to separately describe the electrodes 31A, 31B, 31C, and 31D, they are collectively referred to as the "electrode 31."

Figure 3:
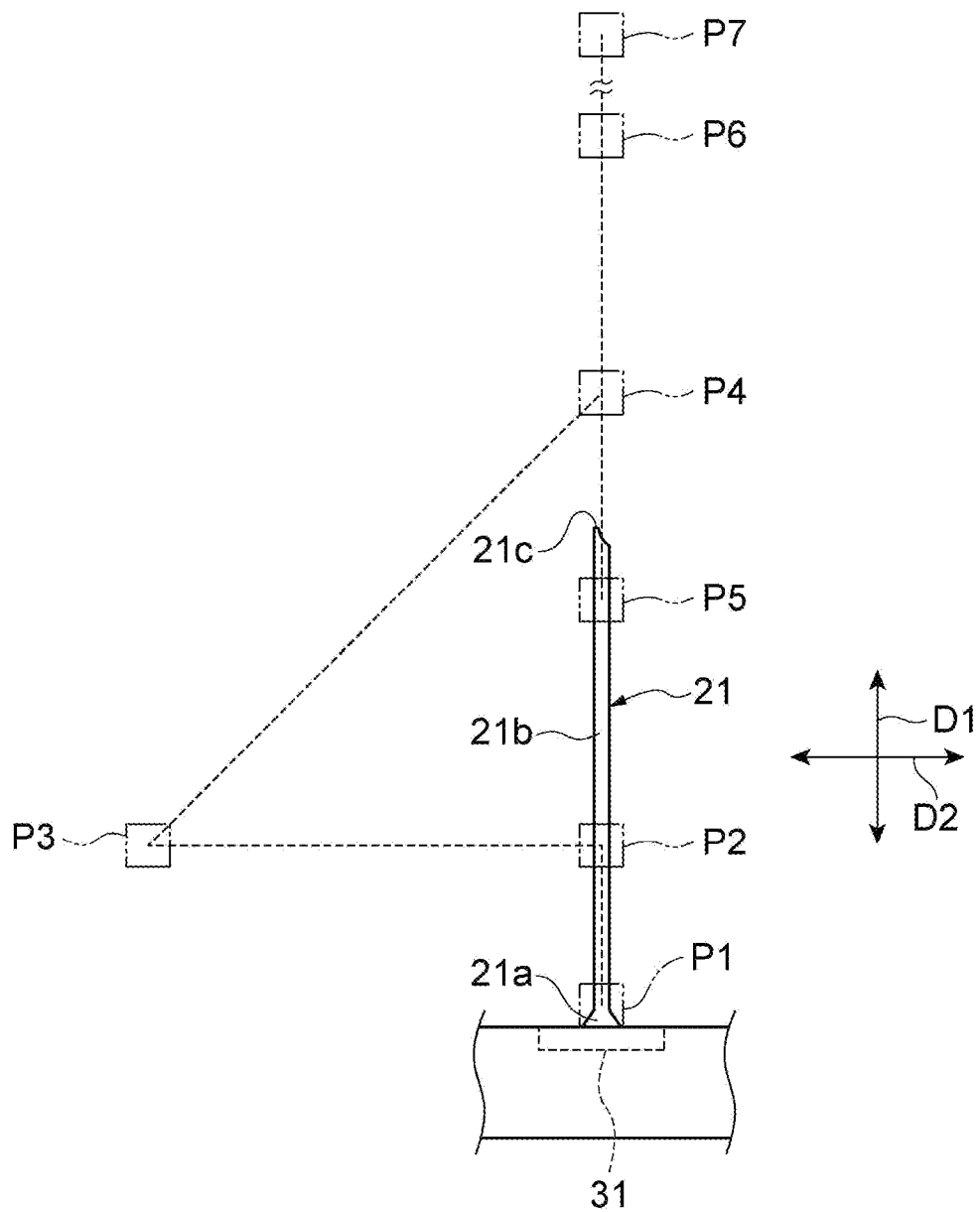
FIG. 3 is a diagram showing the shape of the pin wire shown in FIG. 2 and the target point of the capillary.
Figure 4:
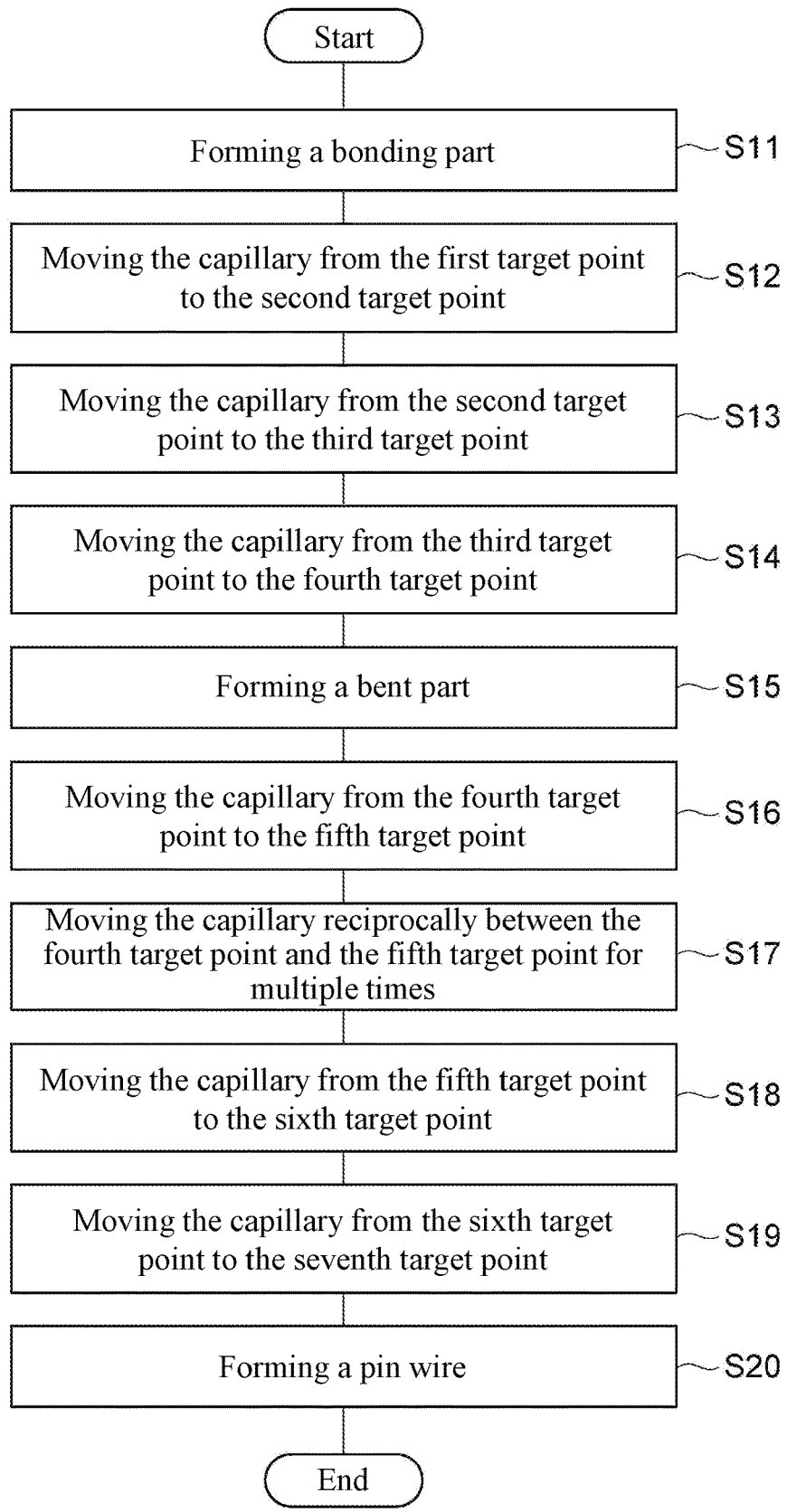
FIG. 4 is a flow chart showing steps included in the manufacturing method of the semiconductor device of the present invention.

FIG. 3 shows the shape of the pin wire 21. As shown in FIG. 3, the pin wire 21 includes a bonding part 21a and a wire part 21b. The bonding part 21a is a part configuring the lower end part of the pin wire 21. The bonding part 21a corresponds to a bonding part 20a (joint part) of the wire 20 to be described later. The bonding part 21a is physically and electrically connected to the electrode 31. The state of being physically connected means a state in which the pin wire 21 is joined to the electrode 31. For example, the bonding part 21a may be a part that generates a resistance force (reaction force) against a tensile force. The state of being electrically connected means a state in which the electric resistance between the pin wire 21 and the electrode 31 is extremely small. The bonding part 21a is formed by the capillary 8 pressing a spherical free air ball (FAB) formed at the tip of the wire 20 against the electrode 31. Therefore, the bonding part 21a has a hemispherical shape as if the FAB is crushed and deformed by about half.

The wire part 21b is a main body part of the pin wire 21. The wire part 21b corresponds to a wire part 20b of the wire 20 to be described later. The wire part 21b extends upward from the bonding part 21a. The wire part 21b extends along a normal direction D1 in which the normal line on the surface of the electrode 31 extends. In other words, the wire part 21b is in an upright state with respect to the surface of the electrode 31. The cross section of the wire part 21b is circular. The cross section of the wire part 21b keeps the cross-sectional shape of the wire 20. The upper end part 21c of the wire part 21b has a shape that tapers toward the upper end of the wire part 21b. The upper end part 21c is a cut part of the wire 20 when the pin wire 21 is formed. The upper end part 21c corresponds to a bent part 20c of the wire 20 to be described later. The height from the surface of the electrode 31 to the upper end of the pin wire 21 may be, for example, 100 μm or more. That is, the total length of the pin wire 21 may be, for example, 100 μm or more.

[Manufacturing Method of Semiconductor Device]

The semiconductor device 10 is manufactured by the wire bonding apparatus 1. Hereinafter, the control operation of the control unit 4 in the wire bonding apparatus 1 and the manufacturing method of the semiconductor device 10 will be described.

With reference to FIG. 3, a first target point P1 to a seventh target point P7 to which the tip of the capillary 8 moves will be specifically described. FIG. 3 shows the shape of the pin wire 21 and the first target point P1 to the seventh target point P7. The control unit 4 has information regarding the preset first target point P1 to the seventh target point P7. The control unit 4 provides a control signal to the bonding unit 3 so that the tip of the capillary 8 sequentially moves to the first target point P1 to the seventh target point P7. The control unit 4 provides the bonding unit 3 with a control signal for controlling the allowance and stop of the feeding of the wire 20 during movement. The control unit 4 provides the bonding unit 3 with a control signal for controlling the allowance and stop of supply of ultrasonic waves and the like from the capillary 8. The tip of the capillary 8 indicates the position of a tip surface 8a (see FIG. 8) of the capillary 8. The tip surface 8a is, for example, a plane parallel to the surface of the electrode 31. The tip surface 8a is circular when viewed from the normal direction D1. Therefore, the tip of the capillary 8 may be, for example, the center position of the tip surface 8a when viewed from the normal direction D1.

In the following description, a case where the semiconductor component 12 is fixed and the capillary 8 moves is exemplified. However, the trajectory drawn by the first target point P1 to the seventh target point P7 may be drawn by the relative positional relationship between the semiconductor component 12 and the capillary 8. As described below, the trajectory drawn by the first target point P1 to the seventh target point P7 may be drawn by moving only the capillary 8. The trajectory drawn by the first target point P1 to the seventh target point P7 may be drawn by moving both the semiconductor component 12 and the capillary 8. For example, the movement in the up-down direction may correspond to the movement of the capillary 8. The movement in the left-right direction may correspond to the movement of the semiconductor component 12.

The first target point P1 indicates a position where the wire 20 is bonded to the electrode 31. The first target point P1 indicates a position where the bonding part 21a of the pin wire 21 is formed. The first target point P1 indicates the position of the bonding part 21a. The first target point P1 may be a position on the surface of the electrode 31 and may be a position at the center of the bonding part 21a when viewed from the normal direction D1.

The second target point P2 is set at a position directly above the first target point P1. The second target point P2 is a position on the normal line of the surface of the electrode 31 passing through the first target point P1. In the following description, the direction away from the electrode 31 along the normal line of the surface of the electrode 31 is referred to as the "upward direction." The direction toward the electrode 31 along the normal line is referred to as the "downward direction." The second target point P2 is a position deviated in the upward direction with respect to the first target point P1.

The third target point P3 (first position) is set at a position deviated from the normal line of the electrode 31 that passes through the first target point P1 and the second target point P2. The direction in which a parallel axis perpendicular to the normal line of the electrode 31 extends is defined as a "parallel axial direction D2." The third target point P3 is set at a position separated from the second target point P2 by a predetermined distance along the parallel axial direction D2. In the following description, the direction from the electrode 31A to the electrode 31B along the parallel axial direction D2 is referred to as the "right direction." The direction from the electrode 31B to the electrode 31A along the parallel axial direction D2 is referred to as the "left direction." The third target point P3 is a position separated from the second target point P2 by a predetermined distance in the left direction. The distance from the first target point P1 to the second target point P2 may be determined based on the height of the pin wire 21 from the surface of the electrode 31 (total length of the pin wire 21). The distance from the second target point P2 to the third target point P3 may also be determined based on the height of the pin wire 21 from the surface of the electrode 31 (total length of the pin wire 21). The distance from the second target point P2 to the third target point P3 may be equal to the distance from the first target point P1 to the second target point P2. The distance from the second target point P2 to the third target point P3 may be longer than the distance from the first target point P1 to the second target point P2. The distance from the second target point P2 to the third target point P3 may be shorter than the distance from the first target point P1 to the second target point P2.

The fourth target point P4 (second position) is set at a position above the third target point P3. Further, the fourth target point P4 (second position) is a position deviated to the first target point P1 side with respect to the third target point P3 when viewed from the normal direction D1. The fourth target point P4 is set at a position deviated upward along the normal direction D1 with respect to the third target point P3. Further, the fourth target point P4 is set at a position deviated to the first target point P1 side along the parallel axial direction D2 with respect to the third target point P3. The fourth target point P4 is set at a position separated by a predetermined distance in each of the upward direction and the right direction with respect to the third target point P3. In the present invention, the fourth target point P4 is set at a position directly above the first target point P1 and the second target point P2. The fourth target point P4 is set at a position on the normal line of the electrode 31 that passes through the first target point P1 and the second target point P2. Therefore, the first target point P1, the second target point P2, and the fourth target point P4 are set on the same line. The position of the fourth target point P4 does not have to be directly above the first target point P1 and the second target point P2. The fourth target point P4 may be set at a position deviated from the normal line of the electrode 31 that passes through the first target point P1 and the second target point P2. For example, the position of the fourth target point P4 may be a position between the third target point P3 and the first target point P1 and the second target point P2 when viewed from the normal direction D1. The position of the fourth target point P4 may be a farther position than the first target point P1 and the second target point P2 with respect to the third target point P3.

The fifth target point P5 is set at a position deviated in the downward direction with respect to the fourth target point P4. Therefore, the fifth target point P5 is set on the same line as the first target point P1, the second target point P2, and the fourth target point P4 in the normal direction. In the present invention, the fifth target point P5 is set at a position above the second target point P2. Specifically, the fifth target point P5 is set at a position between the second target point P2 and the fourth target point P4 in the normal direction D1. The fifth target point P5 may be set at a position lower than the second target point P2. For example, the fifth target point P5 may be set at a position between the first target point P1 and the second target point P2 in the normal direction D1.

The sixth target point P6 is set at a position deviated in the upward direction with respect to the fourth target point P4. The seventh target point P7 is set at a position deviated in the upward direction with respect to the sixth target point P6. Therefore, the first target point P1, the second target point P2, the fourth target point P4, the fifth target point P5, the sixth target point P6, and the seventh target point P7 are set on the same line in the normal direction. When the capillary 8 moves to the seventh target point P7, the wire 20 is cut. By cutting the wire 20, the pin wire 21 is formed.

The control operation of the control unit 4 and the manufacturing method of the semiconductor device 10 will be described with reference to FIGS. 4, 5, 6, and 7. The case where the pin wires 21A, 21B, 21C, and 21D are formed in the order of the semiconductor chip 12A on the lowermost level to the semiconductor chip 12D on the uppermost level will be described. However, the steps for forming the pin wires 21A, 21B, 21C, and 21D are the same. Here, an example of forming the pin wire 21A on the electrode 31A of the semiconductor chip 12A will be described as a representative.

<First Step>

The control unit 4 provides the bonding unit 3 with a first control signal. The first control signal includes an operation of moving the capillary 8 to the first target point P1 (step S11), an operation of moving the capillary 8 to the second target point P2 (step S12), an operation of moving the capillary 8 to the third target point P3 (step S13), an operation of emitting ultrasonic waves from the capillary 8 for a predetermined period, and an operation of allowing the feeding of the wire 20 from the capillary 8.

Figure 7:
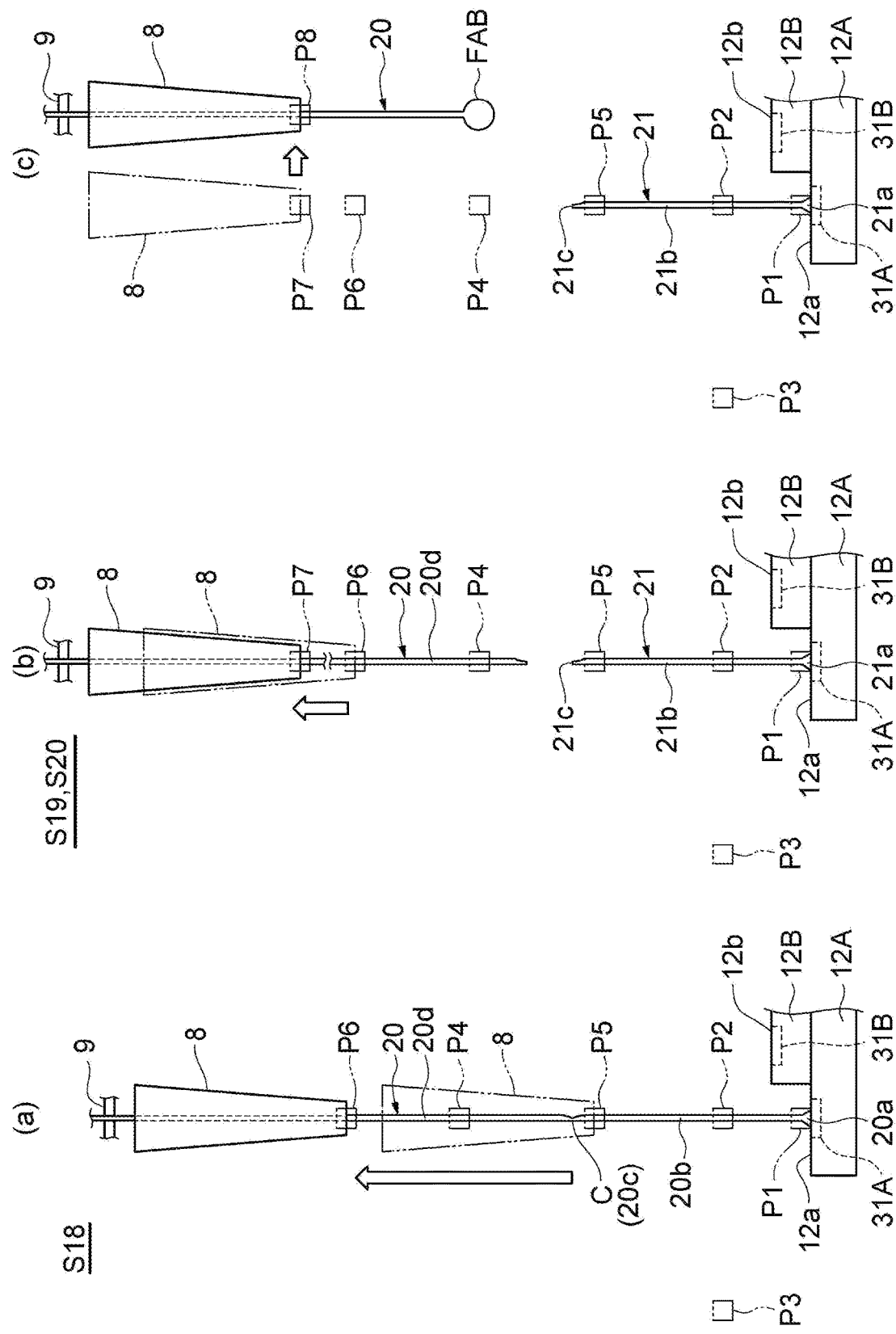
In FIG. 7, (a), (b), and (c) are diagrams showing steps following FIG. 6.

The bonding unit 3 that has received the first control signal forms a spherical FAB (see (c) of FIG. 7) at the tip of the wire 20 that is fed out from the capillary 8. Next, the bonding unit 3 moves the capillary 8 to the first target point P1 (see step S11 and (a) of FIG. 5). At this time, the capillary 8 presses the wire 20 against the electrode 31. Next, the bonding unit 3 emits ultrasonic waves from the capillary 8 for a predetermined period of time. The FAB of the wire 20 is deformed by the emission of ultrasonic waves, and the wire 20 is joined to the electrode 31A. As a result, the bonding part 20a is formed.

Next, the bonding unit 3 opens the wire clamper 9. As a result, the wire 20 is allowed to be fed out from the capillary 8. With the wire clamper 9 open, the bonding unit 3 moves the capillary 8 from the first target point P1 to the second target point P2 (see step S12 and (b) of FIG. 5). As a result, the bonding unit 3 moves the capillary 8 from the first target point P1 to the second target point P2 while feeding out the wire 20.

Figure 5:
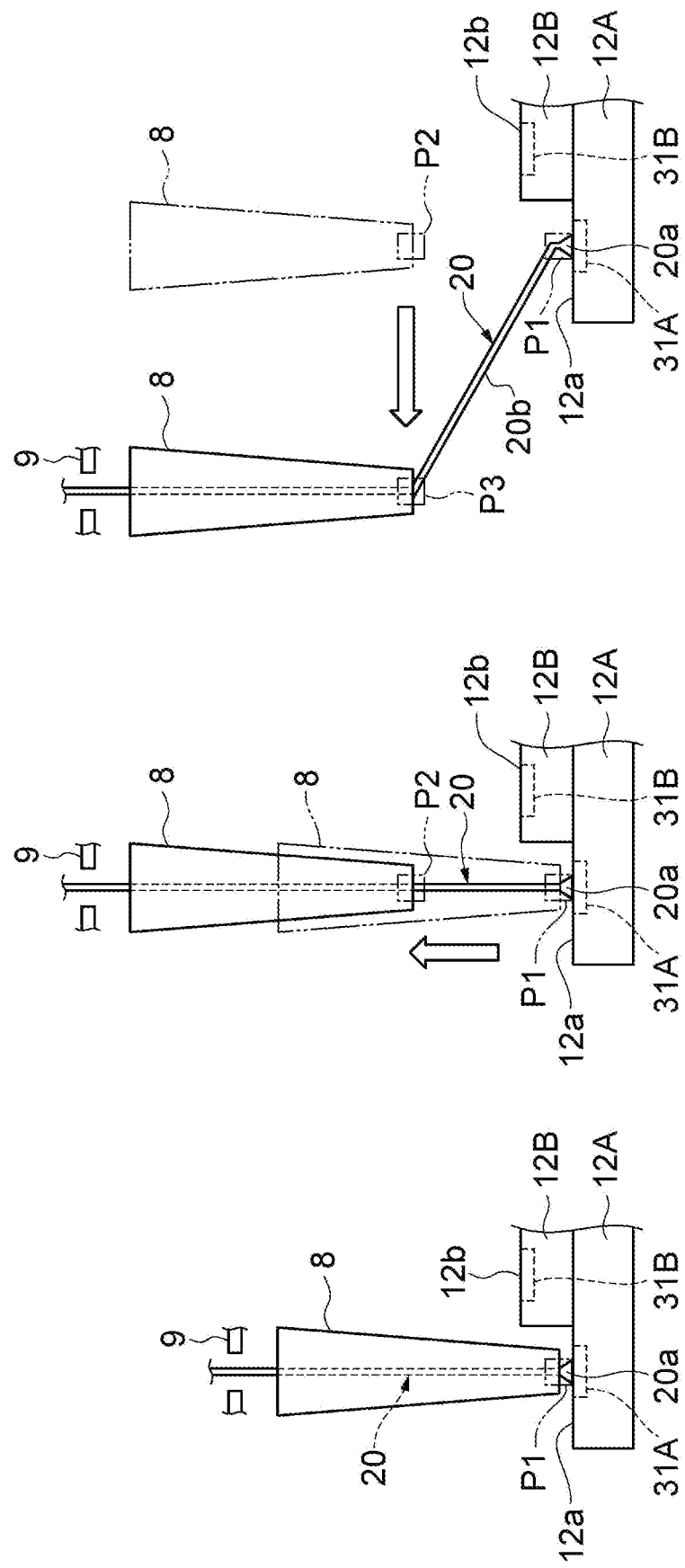
In FIG. 5, (a), (b), and (c) are diagrams showing steps in the manufacturing method of the semiconductor device of the present invention.

Next, the bonding unit 3 moves the capillary 8 from the second target point P2 to the third target point P3 while feeding out the wire 20 (see step S13 and (c) of FIG. 5). At this time, the wire 20 is pulled out by a predetermined length. As a result, the wire part 20b extending from the bonding part 20a to the capillary 8 is formed. As described above, the wire part 20b corresponds to the wire part 21b which is the main body part of the pin wire 21. Therefore, the wire part 20b can be said to be a planned pin wire forming part with which the pin wire 21 is planned to be formed.

In steps S12 and S13, it is sufficient that the capillary 8 can be moved from the first target point P1 to the third target point P3. For example, instead of steps S12 and S13, a step of directly moving the capillary 8 from the first target point P1 to the third target point P3 may be performed. In other words, the capillary 8 does not have to pass through the second target point P2. For example, the capillary 8 may be moved along the trajectory of a straight line connecting the first target point P1 and the third target point P3. The capillary 8 may be moved along the trajectory of an arc passing through the first target point P1 and the third target point P3.

<Second Step>

The control unit 4 provides a second control signal to the bonding unit 3. The second control signal includes an operation of moving the capillary 8 to the fourth target point P4 and an operation of allowing the feeding of the wire 20 from the capillary 8 (step S14).

Figure 6:
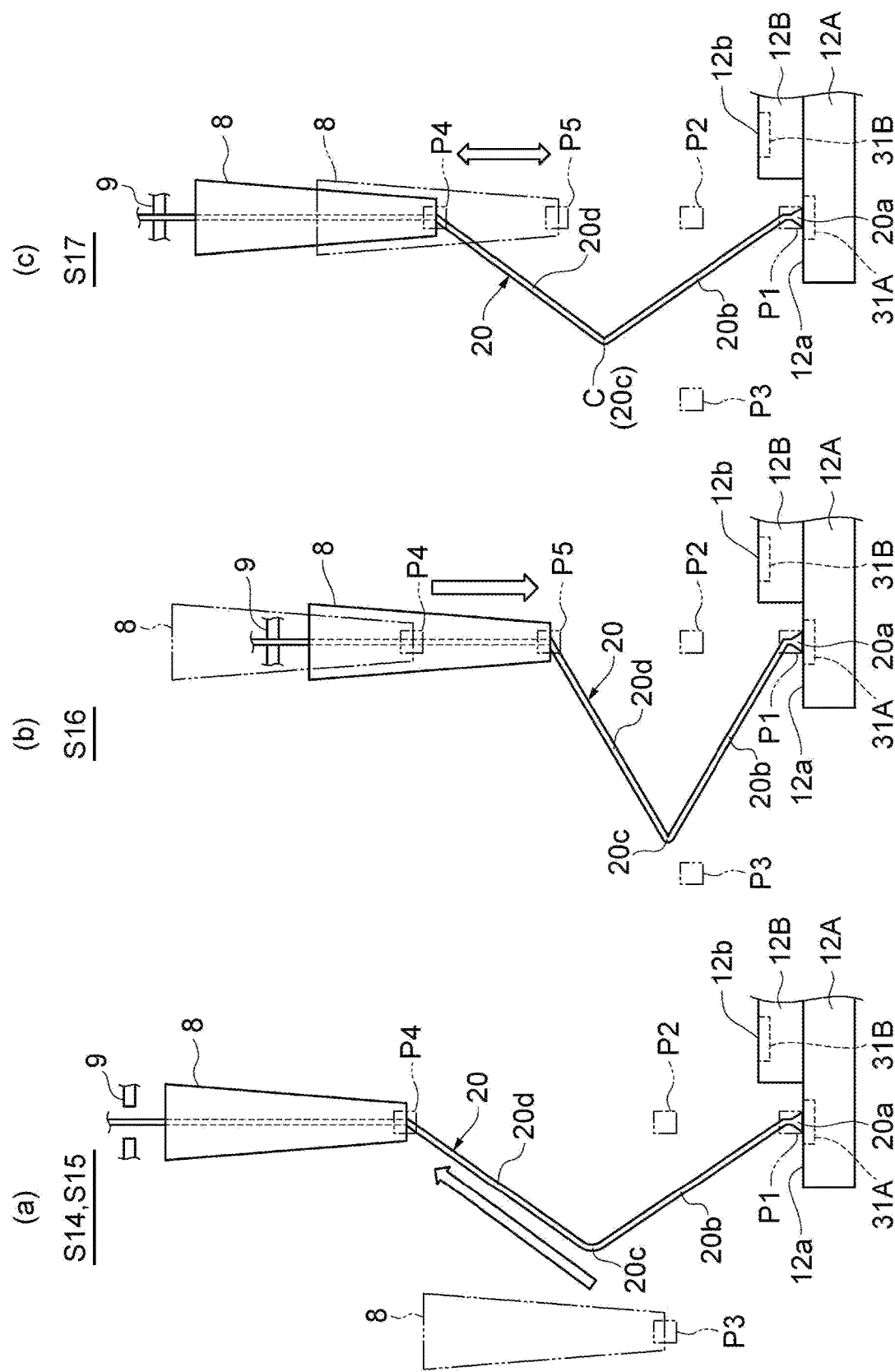
In FIG. 6, (a), (b), and (c) are diagrams showing steps following FIG. 5.

The bonding unit 3 that has received the second control signal moves the capillary 8 from the third target point P3 to the fourth target point P4 while feeding out the wire 20 (see step S14 and (a) of FIG. 6). The bent part 20c is formed above the wire part 20b by step S14. Further, a wire part 20d is formed above the bent part 20c (step S15). The bent part 20c is located between the wire part 20b and the wire part 20d. The bent part 20c changes the axial direction (extending direction) of the wire part 20d that extends from the bent part 20c to the capillary 8 from the axial direction (extending direction) of the wire part 20b that extends from the bonding part 20a to the bent part 20c. The bent part 20c is formed by increasing the degree of bending in the wire 20. When the degree of bending in the bent part 20c becomes large, the deformation of the bent part 20c shifts from elastic deformation to plastic deformation. When the bent part 20c is plastically deformed, the bent part 20c does not return to its original shape (straight line). As a result, the wire 20 maintains a bent shape (arc shape).

In steps S14 and S15, the bent part 20c does not stay at the third target point P3 in response to the movement of the capillary 8 from the third target point P3 to the fourth target point P4. In step S14 and step S15, the bent part 20c slightly moves from the third target point P3 to the fourth target point P4 side. The bent part 20c after movement is not located on the normal line of the electrode 31 that passes through the bonding part 20a. The bent part 20c is located at a position deviated from the normal line that passes through the bonding part 20a. Therefore, the axial direction of the wire part 20b that extends from the bonding part 20a to the bent part 20c is inclined from the normal direction D1. Further, the axial direction of the wire part 20d that extends from the bent part 20c to the capillary 8 is also inclined from the normal direction D1. More specific shapes of the wire 20 in steps S14 and S15 will be described later.

In step S14, the capillary 8 may be moved along the trajectory of a straight line connecting the third target point P3 and the fourth target point P4. In step S14, the capillary 8 may be moved along the trajectory of an arc passing through the third target point P3 and the fourth target point P4. In step S14, the capillary 8 does not have to be moved directly from the third target point P3 to the fourth target point P4. The capillary 8 may be moved from the third target point P3 to the fourth target point P4 after passing through another target point. For example, the capillary 8 may be moved in the right direction from the third target point P3 to another target point, and then the capillary 8 may be moved in the upward direction from another target point to the fourth target point P4.

<Third Step>

The control unit 4 provides a third control signal to the bonding unit 3. The third control signal includes an operation of stopping the feeding of the wire 20 from the capillary 8, an operation of moving the capillary 8 to the fifth target point P5 (step S16), and an operation of reciprocally moving the capillary 8 between the fourth target point P4 and the fifth target point P5 (step S17).

The bonding unit 3 that has received the third control signal closes the wire clamper 9. As a result, the feeding of the wire 20 from the capillary 8 is stopped. Further, the bonding unit 3 lowers the capillary 8 from the fourth target point P4 to the fifth target point P5 (see step S16 and (b) of FIG. 6). At this time, the wire part 20b and the wire part 20d are bent from each other with the bent part 20c as the starting point. In other words, the angle between the wire part 20b and the wire part 20d becomes smaller, and the degree of bending of the bent part 20c becomes larger. Then, the tensile force acts on the outside (left side) of the bent part 20c, while the compressive force acts on the inside (right side) of the bent part 20c. As a result, a part of the bent part 20c is deformed so as to be crushed in the direction perpendicular to the axial direction of the bent part 20c. Therefore, a part of the bent part 20c is thinner than other parts of the bent part 20c. That is, the mechanical strength of the bent part 20c is lower than the mechanical strength of other parts of the wire 20.

Next, the bonding unit 3 reciprocally moves the capillary 8 between the fourth target point P4 and the fifth target point P5 in a state where the feeding of the wire 20 from the capillary 8 is stopped (see step S17 and (c) of FIG. 6). The capillary 8 repeats the movement from the fifth target point P5 to the fourth target point P4 and the movement from the fourth target point P4 to the fifth target point P5. In steps S16 and S17, the lowering of the capillary 8 from the fourth target point P4 to the fifth target point P5 and the raising of the capillary 8 from the fifth target point P5 to the fourth target point P4 are repeated for multiple times. By repeating the lowering and raising operations of the capillary 8, the bending operation of the wire part 20b and the wire part 20d with the bent part 20c as the starting point is performed for multiple times. Repeated stress acts on the bent part 20c due to the bending operation performed for multiple times.

Repeated stress causes fatigue in the bent part 20c. Fatigue further reduces the mechanical strength of the bent part 20c. As a result, the mechanical strength of the bent part 20c is lower than the mechanical strength of the connecting part of the bonding part 20a with the wire part 20b. The bent part 20c is a planned cut part C having a lower mechanical strength than the bonding part 20a. The planned cut part C is a part where the wire 20 is planned to be cut in steps S19 and S20 (see (b) of FIG. 7) to be described later. In steps S16 and S17, the repeated lowering and raising operations of the capillary 8 are performed for multiple times until the mechanical strength of the planned cut part C becomes lower than the mechanical strength of the bonding part 20a.

The mechanical strength of the connecting part of the bonding part 20a with the wire part 20b tends to be lower than that of the other parts of the wire 20. The bonding part 20a is formed by the capillary 8 pressing the FAB formed at the tip of the wire 20 against the electrode 31A. When the FAB is bonded to the electrode 31A, the size of the metal crystal in the FAB changes. As a result, the size of the metal crystal is different between the FAB and the part of the wire 20 other than the FAB. At the boundary part of the wire 20, which is the boundary where the size of the metal crystal changes, the mechanical strength tends to decrease. The boundary part corresponds to the connecting part of the bonding part 20a with the wire part 20b. Therefore, the mechanical strength of the connecting part tends to be lower than the mechanical strength of the other parts of the wire 20. If the wire 20 is simply pulled in the upward direction without reducing the mechanical strength of the other parts of the wire 20 other than the connecting part, the wire 20 is likely to be cut at the connecting part. Therefore, the mechanical strength of the planned cut part C is made lower than the mechanical strength of the connecting part of the bonding part 20a. As a result, the wire 20 is reliably cut at the planned cut part C without cutting the wire 20 at the connecting part.

In the present invention, the capillary 8 is moved reciprocally between the fourth target point P4 and the fifth target point P5. Therefore, the movement distance of the capillary 8 from the fourth target point P4 to the fifth target point P5 is equal to the movement distance of the capillary 8 from the fifth target point P5 to the fourth target point P4. However, these movement distances do not have to be equal to each other. The movement distance may be different from each other. The movement distance may change each time the capillary 8 is repeatedly lowered and raised. In the present invention, the wire clamper 9 is closed when the capillary 8 is repeatedly lowered and raised. In a state where the feeding of the wire 20 from the capillary 8 is stopped, the capillary 8 is repeatedly lowered and raised. As a result, repeated stress can be efficiently applied to the bent part 20c. Therefore, the bent part 20c can be more reliably processed into the planned cut part C having a lower mechanical strength than the bonding part 20a.

<Fourth Step>

The control unit 4 provides a fourth control signal to the bonding unit 3. The fourth control signal includes an operation of moving the capillary 8 to the sixth target point P6 (step S18) and an operation of moving the capillary 8 to the seventh target point P7 (step S19).

The bonding unit 3 that has received the fourth control signal moves the capillary 8 from the fifth target point P5 to the sixth target point P6 in a state where the feeding of the wire 20 from the capillary 8 is stopped (see step S18 and (a) of FIG. 7). The wire part 20b, the planned cut part C, and the wire part 20d are pulled in the upward direction as the capillary 8 is raised. As a result, the wire part 20b, the planned cut part C, and the wire part 20d are in a state along the normal direction D1.

Next, the bonding unit 3 moves the capillary 8 from the sixth target point P6 to the seventh target point P7 in a state where the feeding of the wire 20 from the capillary 8 is stopped (see step S19 and (b) of FIG. 7). The capillary 8 is further raised from the state shown in (a) of FIG. 7. At this time, the wire 20 is pulled in the axial direction (upward direction) with the raise of the capillary 8. The mechanical strength of the planned cut part C is lower than the mechanical strength of the bonding part 20a. The mechanical strength of the planned cut part C is the lowest as compared with the other parts of the wire 20. When the wire 20 is pulled in the axial direction, the wire 20 is cut at the planned cut part C having the lowest mechanical strength. As a result, the pin wire 21A is formed on the electrode 31A (step S20).

Next, the control unit 4 forms a FAB at the tip of the wire 20. Next, the control unit 4 moves the capillary 8 to an eighth target point P8 directly above the electrode 31B of the semiconductor chip 12B on the next level. After that, a series of steps from step S11 to step S20 is performed again on the electrode 31B. As a result, the pin wire 21B is formed on the electrode 31B. After that, a series of steps from step S11 to step S20 is performed again on the electrode 31C. As a result, the pin wire 21C is formed on the electrode 31C. After that, a series of steps from step S11 to step S20 is performed again on the electrode 31D. As a result, the pin wire 21D is formed on the electrode 31D. Through the above steps, the semiconductor device 10 shown in FIG. 2 is obtained. The order in which the pin wire 21 is formed is not limited to the above-mentioned example. For example, the pin wires 21D, 21C, 21B, and 21A may be formed in the order of the semiconductor chip 12D on the uppermost level to the semiconductor chip 12A on the lowermost level. Further, the pin wire 21 may be formed in any order.

Figure 8:
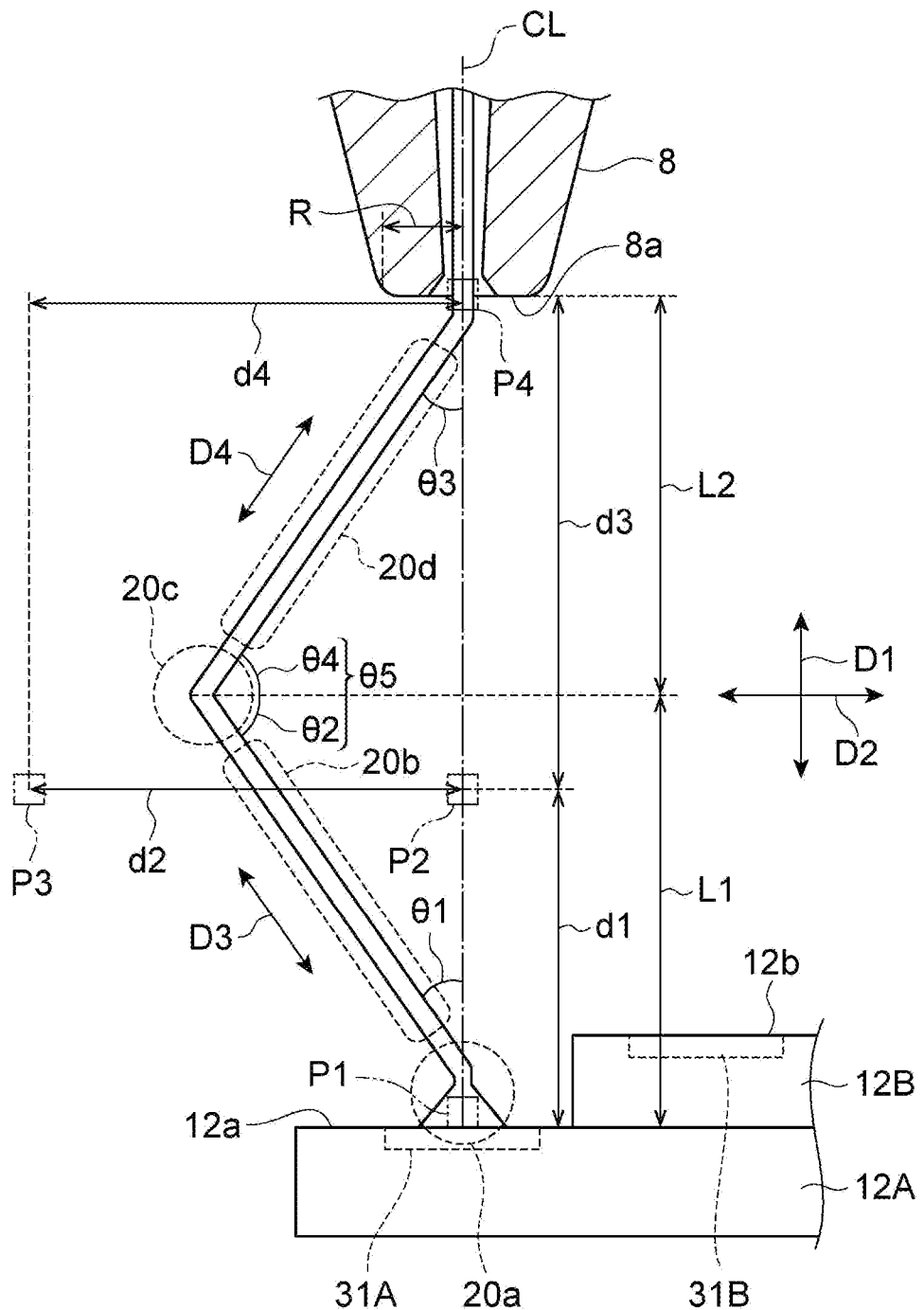
FIG. 8 is a diagram showing the shape of the wire in the step of (a) of FIG. 6.

With reference to FIG. 8, the shape of the wire 20 in steps S14 and S15 will be described in detail. In a state where the capillary 8 is located at the fourth target point P4, the wire 20 includes the bonding part 20a, the wire part 20b, the bent part 20c, and the wire part 20d.

The wire part 20b is a part of the wire 20 that continuously extends from the bonding part 20a to the bent part 20c. The axial direction D3 of the wire part 20b is inclined with respect to the normal direction D1 and the parallel axial direction D2. The axial direction D3 of the wire part 20b includes a component in the normal direction D1 and a component in the parallel axial direction D2. The angle θ1 formed by the axial direction D3 and the normal direction D1 of the wire part 20b is greater than 0° and less than 90°. The angle θ1 is an acute angle. The angle θ1 may be, for example, a value included in the range of greater than or equal to 15° and less than or equal to 65°. Preferably, the angle θ1 may be a value included in the range of greater than or equal to 25° and less than or equal to 40°. The angle θ2 formed by the axial direction D3 and the parallel axial direction D2 of the wire part 20b may also be a value included in a range of greater than 0° and less than 90°. The angle θ2 may be, for example, a value included in the range of greater than or equal to 25° and less than or equal to 75°. Preferably, the angle θ2 may be a value included in the range of greater than or equal to 25° and less than or equal to 40°. The angle θ2 may be different from the angle θ1. The angle θ2 may be equal to the angle θ1.

The wire part 20d is a part of the wire 20 that continuously extends from the bent part 20c to the capillary 8. The axial direction D4 of the wire part 20d is inclined with respect to the normal direction D1 and the parallel axial direction D2. The axial direction D4 of the wire part 20d includes a component in the normal direction D1 and a component in the parallel axial direction D2. The angle θ3 formed by the axial direction D4 and the normal direction D1 of the wire part 20d is a value included in a range of greater than 0° and less than 90°. The angle θ3 may be, for example, a value included in the range of greater than or equal to 15° and less than or equal to 65°. Preferably, the angle θ3 may be a value included in the range of greater than or equal to 25° and less than or equal to 40°. The angle θ4 formed by the axial direction D4 and the parallel axial direction D2 of the wire part 20d is also a value included in a range of greater than 0° and less than 90°. The angle θ4 may be, for example, a value included in the range of greater than or equal to 25° and less than or equal to 75°. Preferably, the angle θ4 may be a value included in the range of greater than or equal to 25° and less than or equal to 40°. The angle θ4 may be different from the angle θ3. The angle θ4 may be equal to the angle θ3.

The axial direction D4 of the wire part 20d intersects the axial direction D3 of the wire part 20b. The axial direction D4 of the wire part 20d is different from the axial direction D3 of the wire part 20b. The angle θ5 formed by the axial direction D4 of the wire part 20d and the axial direction D3 of the wire part 20b is represented by the total value of the angle θ2 and the angle θ4. The angle θ5 is a value included in a range of greater than 0° and less than 180°. The angle θ5 may be, for example, a value included in the range of greater than or equal to 50° and less than or equal to 150°. Preferably, the angle θ5 may be a value included in the range of greater than or equal to 50° and less than or equal to 80°.

In the present invention, the angle θ1 is equal to the angle θ3. The angle θ2 is equal to the angle θ4. The shape of the wire part 20d is symmetrical to the shape of the wire part 20b with respect to the parallel axis that passes through the center of the bent part 20c. Therefore, the length of the wire part 20b in the axial direction D3 is equal to the length of the wire part 20d in the axial direction D4. The length L1 from the parallel axis that passes through the center of the bent part 20c in the up-down direction to the surface of the electrode 31A is equal to the length L2 from the parallel axis to the tip surface 8a of the capillary 8. The ratio (L1/L2) of the length L1 to the length L2 is 1. The ratio (L1/L2) of the length L1 to the length L2 is "L1:L2=1:1". As an example, the length L1 is 300 μm. The length L2 is also 300 μm. The length L1 and the length L2 do not have to be equal to each other. The length L1 and the length L2 may be different from each other. The ratio (L1/L2) of the length L1 to the length L2 may be a value included in the range of greater than or equal to 0.5 and less than or equal to 2.0. Preferably, the ratio (L1/L2) of the length L1 to the length L2 may be a value included in the range of greater than or equal to 0.7 and less than or equal to 1.5. Each of the length L1 and the length L2 may be, for example, a value included in the range of greater than or equal to 200 μm and less than or equal to 400 μm. Preferably, each of the length L1 and the length L2 may be a value included in the range of greater than or equal to 250 μm and less than or equal to 350 μm.

The length of the wire part 20b in the axial direction D3 corresponds to the distance from the first target point P1 to the third target point P3. The movement distance d1 and the movement distance d2 are defined. The movement distance d1 is the distance for which the capillary 8 moves from the first target point P1 to the third target point P3 along the normal direction D1. The movement distance d1 can also be said to be the distance for which the capillary 8 moves from the first target point P1 to the third target point P3 when viewed from the parallel axial direction D2. The movement distance d2 is the distance for which the capillary 8 moves from the first target point P1 to the third target point P3 along the parallel axial direction D2. The movement distance d2 can also be said to be the distance for which the capillary 8 moves from the first target point P1 to the third target point P3 when viewed from the normal direction D1. The length of the wire part 20b in the axial direction D3 is determined based on the movement distance d1 and the movement distance d2.

The length of the wire part 20d in the axial direction D4 corresponds to the distance from the third target point P3 to the fourth target point P4. Here, the movement distance d3 and the movement distance d4 are defined. The movement distance d3 is the distance for which the capillary 8 moves from the third target point P3 to the fourth target point P4 along the normal direction D1. The movement distance d3 can also be said to be the distance for which the capillary 8 moves from the third target point P3 to the fourth target point P4 when viewed from the parallel axial direction D2. The movement distance d4 is the distance for which the capillary 8 moves from the third target point P3 to the fourth target point P4 along the parallel axial direction D2. The movement distance d4 can also be said to be the distance for which the capillary 8 moves from the third target point P3 to the fourth target point P4 when viewed from the normal direction D1. The length of the wire part 20b in the axial direction D4 is determined based on the movement distance d3 and the movement distance d4.

In the present invention, the movement distance d2 is equal to the movement distance d4. The movement distance d2 is longer than the radius R of the tip surface 8a of the capillary 8. The movement distance d4 is also longer than the radius R of the tip surface 8a of the capillary 8. The radius R of the tip surface 8a is, for example, 20 μm. The movement distance d3 is slightly longer than the movement distance d1. When the capillary 8 is moved from the third target point P3 to the fourth target point P4, the bent part 20c is slightly deviated from the third target point P3 to the fourth target point P4 side. The movement distance d3 is set longer than the movement distance d1 in consideration of the amount of deviation of the bent part 20c upward from the third target point P3. The movement distance d3 may be equal to the movement distance d1. The movement distance d3 may be shorter than the movement distance d1. The movement distance d2 does not have to be equal to the movement distance d4. The movement distance d2 may be longer than the movement distance d4. The movement distance d2 may be shorter than the movement distance d4. The movement distance d2 may be longer than the movement distance d1. When the movement distance d2 is longer than the movement distance d1, the angle θ2 can be reduced. The degree of bending in the bent part 20c can be increased. As a result, the bent part 20c can be easily formed.

In a state where the capillary 8 is located at the fourth target point P4, the tip surface 8a of the capillary 8 is located directly above the bonding part 20a. The state in which the tip surface 8a is located directly above the bonding part 20a means a state in which the entire bonding part 20a is contained inside the tip surface 8a when viewed from the normal direction D1. In other words, the state in which the tip surface 8a is located directly above the bonding part 20a means that the normal line of the electrode 31 that passes through the bonding part 20a completely passes through the inside of the tip surface 8a when viewed from the normal direction D1. In the present invention, the position of the capillary 8 is set so that the central axis CL of the tip surface 8a passes through the center of the bonding part 20a when viewed from the normal direction D1. However, as long as the tip surface 8a is located directly above the bonding part 20a, the central axis CL of the tip surface 8a may be deviated from the center of the bonding part 20a.

The manufacturing method of the semiconductor device 10 of the present invention and the actions and effects of the wire bonding apparatus 1 described above will be described together with the issues of the comparative examples.

Figure 9:
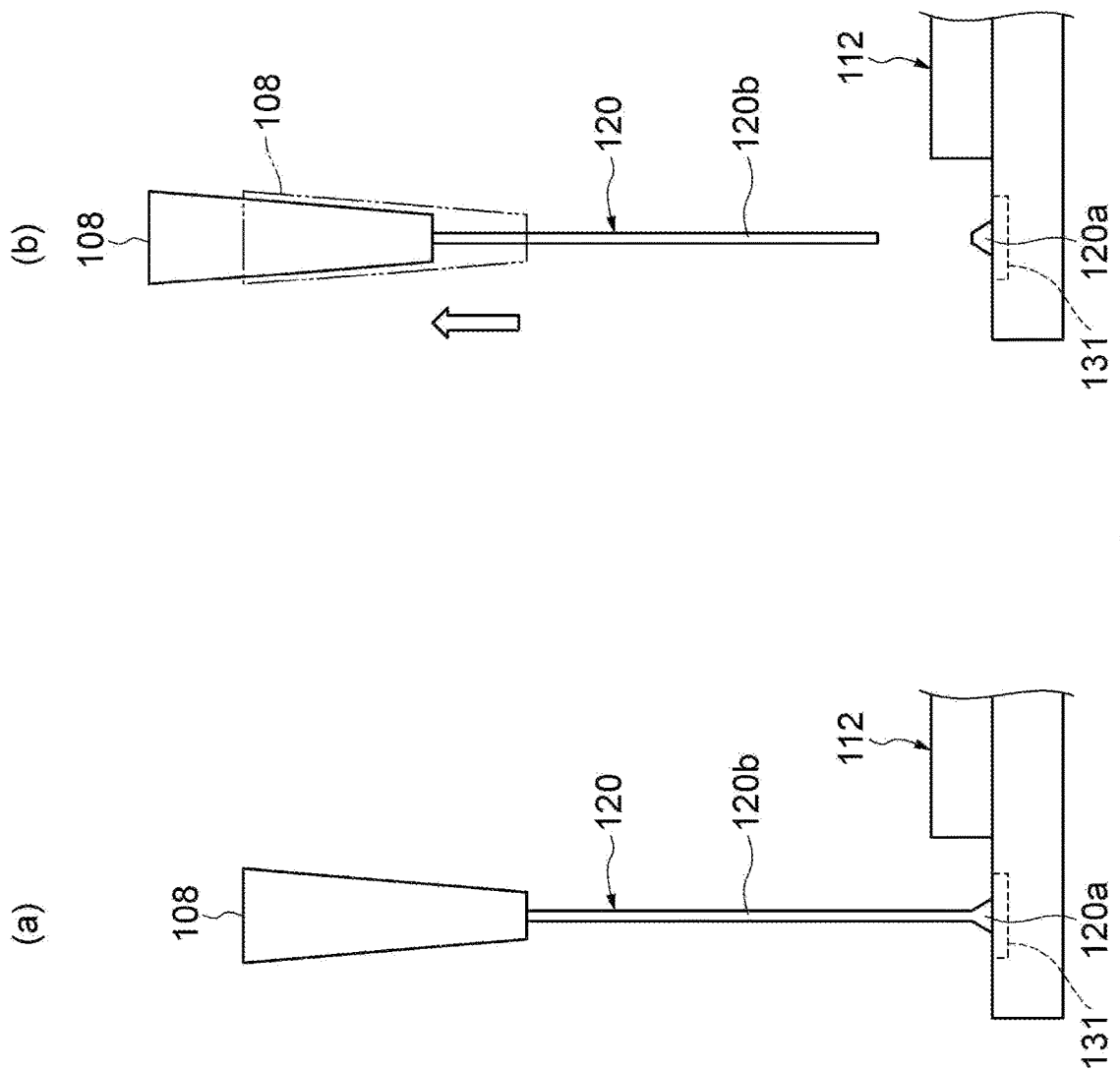
In FIG. 9, (a) and (b) are diagrams showing steps included in the manufacturing method of the semiconductor device according to the first comparative example.

FIG. 9 shows steps included in the manufacturing method of the semiconductor device according to the first comparative example. The manufacturing method according to the first comparative example is different from the manufacturing method of the semiconductor device 10 of the present invention in that a bent part is not formed on the wire. In the manufacturing method according to the first comparative example, first, a wire 120 is bonded to an electrode 131 of a semiconductor component 112 by using a capillary 108. As a result, a bonding part 120a is formed. Next, the capillary 108 is raised while feeding out the wire 120. As a result, a wire part 120b extending upward from the bonding part 120a is formed (see (a) of FIG. 9). Next, the capillary 108 is raised with the wire clamper closed. As a result, the wire 120 is cut (see (b) of FIG. 9). The connecting part between the bonding part 120a and the wire part 120b is a part where the size of the metal crystal changes. Therefore, the mechanical strength of the connecting part is lower than the mechanical strength of the other parts of the wire 120. If the capillary 108 is simply raised in this state, the wire 120 is cut at the connecting part as shown in (b) of FIG. 9. Therefore, it is difficult to form a pin wire extending in a rising direction from the electrode 131 by the manufacturing method of the semiconductor device according to the first comparative example.

Figure 10:
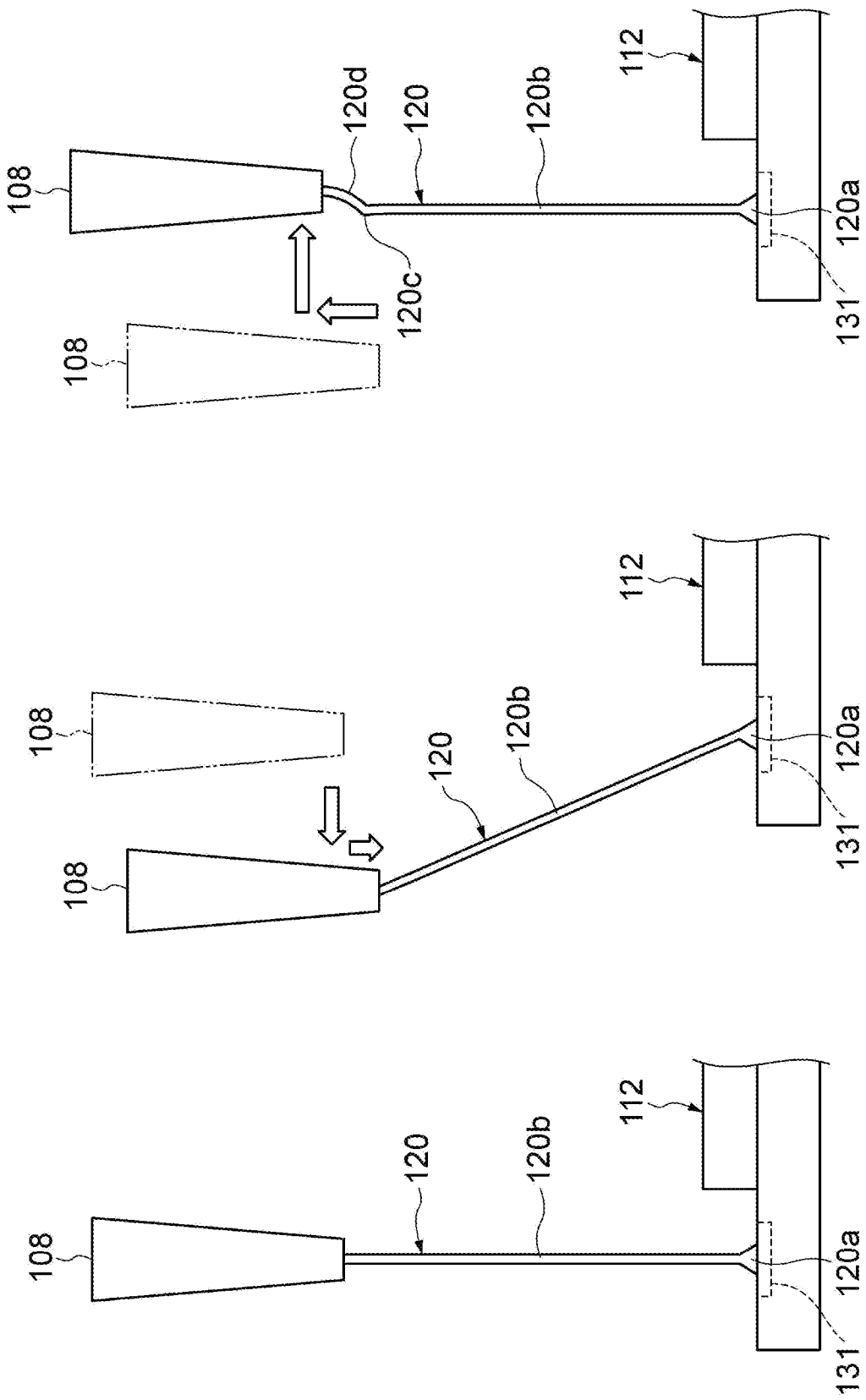
In FIG. 10, (a), (b), and (c) are diagrams showing steps included in the manufacturing method of the semiconductor device according to the second comparative example.
Figure 11:
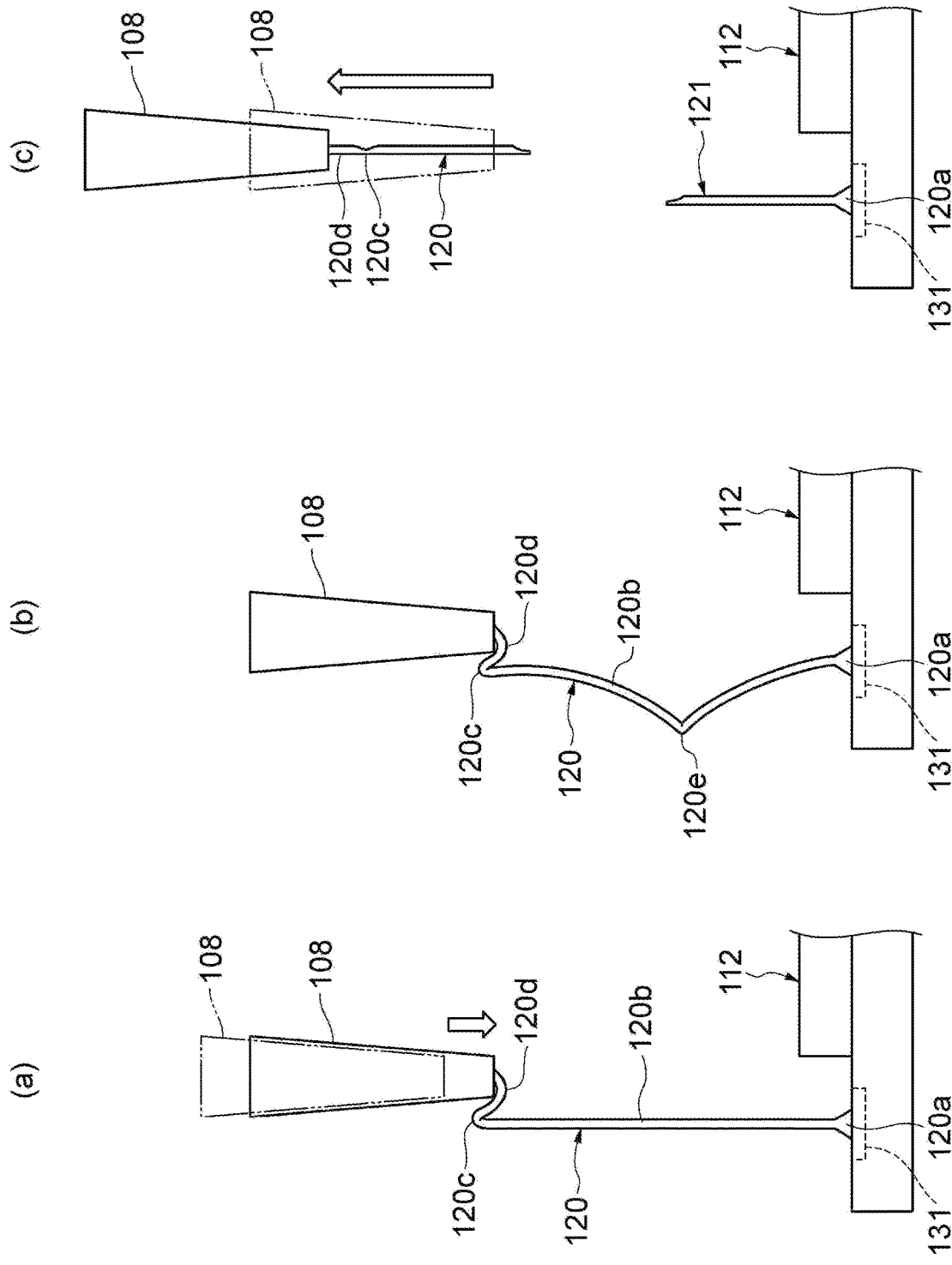
In FIG. 11, (a), (b), and (c) are diagrams showing steps following FIG. 10.

FIG. 10 shows steps included in the manufacturing method of the semiconductor device according to the second comparative example. FIG. 11 shows steps following the steps shown in FIG. 10. The manufacturing method according to the second comparative example is common to the manufacturing method according to the present embodiment in that a bent part (scratched part) is formed on the wire. However, the manufacturing method according to the second comparative example is different from the manufacturing method according to the present embodiment in that the wire is bent in a state where the wire is upright from the electrode. In the manufacturing method according to the second comparative example, first, the wire 120 is bonded to the electrode 131 of the semiconductor component 112 by using the capillary 108. As a result, the bonding part 120a is formed. Next, the capillary 108 is raised while feeding out the wire 120. As a result, the wire part 120b extending upward from the bonding part 120a is formed (see (a) of FIG. 10). Next, the capillary 108 is moved in the left direction. Next, the capillary 108 is lowered (see (b) of FIG. 10). When the capillary 108 is lowered, a scratched part 120c is formed on the wire 120 by the inner edge of the tip of the capillary 108 (see (c) of FIG. 10). Next, the capillary 108 is raised while feeding out the wire 120. Next, the capillary 108 is moved in the right direction. At this time, the wire part 120b is along the normal direction of the surface of the electrode 131. The wire part 120b stands upright from the surface of the electrode 131.

Next, the capillary 108 is lowered. As a result, the wire 120 is bent at the scratched part 120c (see (a) of FIG. 11). The wire 120 bends toward the wire part 120b with the scratched part 120c of the wire part 120d as the starting point. At this time, the axial direction of the wire part 120b is along the normal direction of the surface of the electrode 131. The axial direction of the wire part 120b is the same as the lowering direction of the capillary 108 lowered along the normal direction. In other words, the axial direction of the wire part 120b is the same as the pressing direction of the capillary 108. In this case, the axial force of the wire part 120b increases according to the pressing force of the capillary 108. When the axial force of the wire part 120b becomes large, buckling tends to occur in the wire part 120b (see (b) of FIG. 11). When buckling occurs in the wire part 120b, a bent part 120e is formed in the wire part 120b due to the buckling. At this time, stress acts on the bent part 120e according to the lowering of the capillary 108. As a result, the applied stress reduces the mechanical strength of the bent part 120e. In a state in which the mechanical strength of the bent part 120e is lowered, the wire clamper is closed to raise the capillary 108. As a result, the wire 120 may be cut at the bent part 120e instead of the scratched part 120c (see (c) of FIG. 11). That is, there is a possibility that the wire 120 cannot be cut at the target position (scratched part 120c). As a result, a pin wire 121 lower than the target height is formed. Therefore, it is difficult to form a pin wire having a desired height by the manufacturing method of the semiconductor device according to the second comparative example.

In the manufacturing method of the semiconductor device 10 and the wire bonding apparatus 1, when the bent part 20c is formed on the wire 20, the capillary 8 is moved to the fourth target point P4 after passing through the third target point P3. As a result, when the capillary 8 is moved to the fourth target point P4, the axial direction D3 of the wire part 20b can be inclined from the normal direction D1. In this case, the axial direction D3 of the wire part 20b is different from the pressing direction of the capillary 8. In other words, the axial direction D3 of the wire part 20b is different from the normal direction D1 in which the capillary 8 is lowered. Therefore, when the capillary 8 is lowered, problems such as buckling are less likely to occur in the wire part 20b. That is, when the axial direction D3 of the wire part 20b is different from the pressing direction of the capillary 8, the axial force of the wire part 20b generated in response to the pressing force of the capillary 8 becomes small. As a result, buckling is less likely to occur in the wire part 20b. If a problem such as buckling is suppressed, the situation where the wire 20 is cut at a part other than the planned cut part C when the capillary 8 is raised is suppressed. As a result, the wire 20 can be reliably cut at the planned cut part C. Therefore, the pin wire 21 having a desired height can be easily formed.

In the manufacturing method of the semiconductor device 10 and the wire bonding apparatus 1, unlike the case where a method of cutting the wire 20 by pressing the wire 20 against a surrounding pressing part is used, the wire 20 is cut by the repeated movements of the capillary 8 being lowered and raised in the air. In the manufacturing method of the semiconductor device 10 and the wire bonding apparatus 1, the wire 20 is cut only by the moving operation of the capillary 8 in the air without pressing the wire 20 against the pressing part. When the wire is pressed against the pressing part, the wire is pressed against the pressing part by the capillary. As a result, a thin part is formed on the wire. The thin part of the wire has lower mechanical strength than the other parts of the wire. Therefore, the wire can be cut in the thin part by raising the capillary after forming the thin part. When performing the pressing operation, it is necessary to secure a pressing part having a certain large area around the joint part of the wire in order to press the wire. However, when the position where the pressing part can be secured is limited, it becomes difficult to perform a pressing operation. For example, if the distance from the joint part of the wire to the pressing part is increased to some extent, the components provided between the joint part of the wire and the pressing part interfere with the pressing operation from the joint part to the pressing part. Further, if the position of the pressing part is limited, the position of the thin part formed in the pressing part is limited. As a result, it becomes difficult to form a pin wire having a desired height. In contrast, in the manufacturing method of the semiconductor device 10 and the wire bonding apparatus 1 of the present invention, as described above, it is possible to cut the wire 20 simply by the operation of the capillary 8 in the air. As a result, even in a situation where it is difficult to press the wire 20 against the pressing part, the pin wire 21 having a desired height can be easily formed.

When the capillary 8 is moved to the fourth target point P4, the bent part 20c is located at a position deviated from the normal line of the electrode 31 that passes through the bonding part 20a. In this case, when the capillary 8 is moved to the fourth target point P4, the state in which the axial direction D3 of the wire part 20b is inclined from the normal direction D1 can be more reliably maintained. In other words, it is possible to more reliably maintain a state in which the axial direction D3 of the wire part 20b and the pressing direction of the capillary 8 are different. As a result, it is possible to more reliably suppress a situation in which a problem such as buckling occurs in the wire part 20b. Therefore, the wire 20 can be cut more reliably at the planned cut part C.

When viewed from the normal direction D1, the movement distance of the capillary 8 from the third target point P3 to the fourth target point P4 is longer than the radius of the tip surface 8a of the capillary 8. In this case, it is possible to suppress a situation in which the length of the wire part 20d from the capillary 8 to the bent part 20c becomes extremely short. Therefore, it is possible to suppress a situation in which the repeated stress generated in the bent part 20c becomes extremely small. As a result, the bent part 20c can be more reliably processed into the planned cut part C having a lower mechanical strength than the bonding part 20a. Therefore, the wire 20 can be cut more reliably at the planned cut part C.

When viewed from the normal direction D1, the movement distance of the capillary 8 from the third target point P3 to the fourth target point P4 is equal to the movement distance of the capillary 8 from the bonding part 20a to the third target point P3. In this case, the length of the wire part 20d from the capillary 8 to the bent part 20c can be made equal to the length of the wire part 20b from the bonding part 20a to the bent part 20c. As a result, it is possible to suppress a situation in which the repeated stress generated in the bent part 20c becomes small. As a result, the bent part 20c can be even more reliably processed into the planned cut part C having a lower mechanical strength than the bonding part 20a. Therefore, the wire 20 can be cut even more reliably at the planned cut part C.

When the capillary 8 is moved to the fourth target point P4, the capillary 8 is located directly above the bonding part 20a. In this case, the wire part 20b can be brought upright with respect to the surface of the electrode 31. By closing the wire clamper 9 and raising the capillary 8 in this state, the pin wire 21 in an upright state from the surface of the electrode 31 can be easily obtained.

A series of steps from step S11 to step S20 are performed for each of the semiconductor chips 12A, 12B, 12C, and 12D of the semiconductor component 12. As a result, the pin wire 21 is formed for each of the semiconductor chips 12A, 12B, 12C, and 12D. A series of steps from step S11 to step S20 are performed in the order of the semiconductor chip 12A on the lowermost level to the semiconductor chip 12D on the uppermost level. In the semiconductor component 12, when the method of cutting the wire 20 by the pressing operation of the capillary 8 that presses the wire 20 against the surrounding pressing part is used, it is conceivable to use the main surface 11a of the circuit board 11 having a relatively large area as the pressing part. However, in this method, when the pin wire 21A is formed on the semiconductor chip 12A and then the pin wire 21B is formed on the semiconductor chip 12B on the upper level, the movement of the capillary 8 from the semiconductor chip 12B to the main surface 11a of the circuit board 11 is hindered by the pin wire 21A formed on the semiconductor chip 12A on the way. As a result, it may not be possible to cut the wire 20 by the pressing operation of the capillary 8. In contrast, according to the manufacturing method of the semiconductor device 10 and the wire bonding apparatus 1, the wire 20 can be cut simply by the moving operation of the capillary 8 in the air without performing such a pressing operation. As a result, the pin wire 21 can be easily formed for each of the semiconductor chips 12A, 12B, 12C, and 12D even in a situation where it is difficult to cut the wire 20 by the pressing operation.

Although the embodiment of the present invention has been described above, the implementation is not limited to the above embodiment and may be implemented in various forms.

What is claimed is:

1. A manufacturing method of a semiconductor device, comprising:
   a first step of, after joining a wire to an electrode using a capillary, pulling out the wire to a predetermined length by moving the capillary to a first position while feeding out the wire, wherein the first position is a position above a joint part of the wire and is a position deviated from a normal line of a surface of the electrode that passes through the joint part, wherein the normal line is perpendicular to the surface of the electrode;
   a second step of, after moving the capillary to the first position, forming a bent part on the wire by moving the capillary to a second position while feeding out the wire, wherein the second position is a position above the first position and is a position deviated to the joint part side with respect to the first position when viewed from a normal direction in which the normal line extends;

a third step of, after forming the bent part, processing the bent part into a planned cut part by repeating lowering and raising of the capillary along the normal direction for a plurality of times; and a fourth step of, after repeating the lowering and raising of the capillary for the plurality of times, cutting the wire at the planned cut part by raising the capillary with a wire clamper closed to form a pin wire, wherein the pin wire is stand upright from the surface of the electrode along the normal line.

2. The manufacturing method of the semiconductor device according to claim 1, wherein when the capillary is moved to the second position, the bent part is located at a position deviated from the normal line that passes through the joint part.

3. The manufacturing method of the semiconductor device according to claim 1, wherein when viewed from the normal direction, a movement distance of the capillary from the first position to the second position is longer than a radius of a tip surface of the capillary.

4. The manufacturing method of the semiconductor device according to claim 1, wherein when viewed from the normal direction, a movement distance of the capillary from the first position to the second position is equal to a movement distance of the capillary from the joint part to the first position.

5. The manufacturing method of the semiconductor device according to claim 1, wherein when the capillary is moved to the second position, a tip surface of the capillary is located directly above the joint part.

6. The manufacturing method of the semiconductor device according to claim 1, wherein a plurality of semiconductor chips are stacked in a stepped manner on a board so that a main surface of each of the plurality of semiconductor chips is exposed as an exposed surface, the electrode is provided on the exposed surface of each of the plurality of semiconductor chips, and the pin wire is formed for each of the plurality of semiconductor chips by performing a series of steps from the first step to the fourth step for each of the plurality of semiconductor chips.

7. The manufacturing method of the semiconductor device according to claim 6, wherein the series of steps from the first step to the fourth step are performed in the order of the semiconductor chip on an upper level to the semiconductor chip on a lower level, or from the semiconductor chip on a lower level to the semiconductor chip on an upper level.

8. A wire bonding apparatus, comprising:

a bonding unit that comprises a capillary configured to be movable relative to an electrode; and a control unit that controls an operation of the bonding unit, wherein the control unit provides the bonding unit with:

a first control signal of, after joining a wire to the electrode using the capillary, pulling out the wire to a predetermined length by moving the capillary to a first position while feeding out the wire, wherein the first position is a position above a joint part of the wire and is a position deviated from a normal line of a surface of the electrode that passes through the joint part, wherein the normal line is perpendicular to the surface of the electrode;

a second control signal of, after moving the capillary to the first position, forming a bent part on the wire by moving the capillary to a second position while feeding out the wire, wherein the second position is a position above the first position and is a position deviated to the joint part side with respect to the first position when viewed from a normal direction in which the normal line extends;

a third control signal of, after forming the bent part, processing the bent part into a planned cut part by repeating lowering and raising of the capillary along the normal direction for a plurality of times; and a fourth control signal of, after repeating the lowering and raising of the capillary for the plurality of times, cutting the wire at the planned cut part by raising the capillary with a wire clamper closed to form a pin wire, wherein the pin wire is stand upright from the surface of the electrode along the normal line.

* * * * *